United States Patent
Ishibashi et al.

(10) Patent No.: US 12,014,911 B2
(45) Date of Patent: Jun. 18, 2024

(54) SPUTTERING APPARATUS

(71) Applicant: TOKYO ELECTRON LIMITED, Tokyo (JP)

(72) Inventors: Shota Ishibashi, Yamanashi (JP); Tatsuo Hirasawa, Yamanashi (JP); Hiroyuki Toshima, Yamanashi (JP); Hiroyuki Iwashita, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 552 days.

(21) Appl. No.: 17/206,738

(22) Filed: Mar. 19, 2021

(65) Prior Publication Data

US 2021/0296103 A1 Sep. 23, 2021

(30) Foreign Application Priority Data

Mar. 23, 2020 (JP) .................................. 2020-051460
Sep. 23, 2020 (JP) .................................. 2020-159051

(51) Int. Cl.
*H01J 37/34* (2006.01)
*C23C 14/04* (2006.01)
*C23C 14/34* (2006.01)

(52) U.S. Cl.
CPC ........ *H01J 37/3447* (2013.01); *C23C 14/044* (2013.01); *C23C 14/3464* (2013.01); *H01J 37/3417* (2013.01); *H01J 2237/0458* (2013.01)

(58) Field of Classification Search
CPC ............................. H01J 37/3447; C23C 14/044
See application file for complete search history.

(56) References Cited

U.S. PATENT DOCUMENTS

| | | | | |
|---|---|---|---|---|
| 6,143,149 A | * | 11/2000 | Abe | H01J 37/3447 |
| | | | | 204/298.18 |
| 9,322,095 B2 | * | 4/2016 | Kajihara | C23C 14/564 |
| 11,220,741 B2 | | 1/2022 | Abarra | |
| 2013/0180850 A1 | * | 7/2013 | Rohrmann | H01J 37/347 |
| | | | | 204/298.11 |
| 2019/0352771 A1 | | 11/2019 | Abarra | |

FOREIGN PATENT DOCUMENTS

JP   2019-199639 A   11/2019
JP   2020-026575 A   2/2020

* cited by examiner

*Primary Examiner* — John J Brayton
(74) *Attorney, Agent, or Firm* — Fenwick & West LLP

(57) ABSTRACT

An example of a sputtering apparatus comprises a first target and a second target that emit sputter particles, a substrate support configured to support a substrate, a shielding plate disposed between the first and the second target and the substrate and having a through-hole through which the sputter particles pass, and an obstructing mechanism. The through-hole has a first opening region through which the sputter particles emitted from the fit target pass and a second opening region through which the sputter particles emitted from the second target pass, and the obstructing mechanism is configured to obstruct the sputter particles emitted from the first target in passing through the second opening region and the sputter particles emitted in the second target from passing through the first opening region.

7 Claims, 8 Drawing Sheets

SPUTTERING APPARATUS

CROSS-REFERENCE TO RELATED APPLICATIONS

This application claims priority to Japanese Patent Application Nos. 2020-051460 and 2020-159051, respectively filed on Mar. 23, 2020, and Sep. 23, 2020, the entire disclosure of which is incorporated herein by reference.

TECHNICAL FIELD

The present disclosure relates to a sputtering apparatus.

BACKGROUND

There is known a sputtering apparatus for forming a film by allowing sputter particles emitted from a target to be incident on a substrate such as a wafer or the like.

Japanese Patent Application Publication No. 2020-026575 discloses a film forming apparatus including a first sputter particle emission part and a second sputter particle emission part respectively having targets for emitting sputter particles in different diagonal directions in a processing space, and a sputter particle shielding plate having a through-hole through which the sputter particles emitted from the first sputter particle emission part and the second sputter particle emission part pass.

In a configuration having a plurality of targets for emitting sputter particles, it is difficult to change the shape of a through-hole because the shape change of the through-hole in order to adjust the thickness distribution of the film formed by sputter particles emitted from one or more targets may also affect the thickness distribution of the film formed by sputter particles from the remaining targets.

SUMMARY

One aspect of the present disclosure provides a sputtering apparatus capable of desirably adjusting film thickness distribution.

In accordance with an aspect of the present disclosure, there is provided a sputtering apparatus including: a first target and a second target that emit sputter particles, a substrate support configured to support a substrate, a shielding plate disposed between the first and the second target and the substrate and having a through-hole through which the sputter particles pass, the through-hole having a first opening region through which the sputter particles emitted from the first target pass and a second opening region through which the sputter particles emitted from the second target pass and an obstructing mechanism configured to obstruct the sputter particles emitted from the first target in passing through the second opening region and the sputter particles emitted in the second target from passing through the first opening region.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
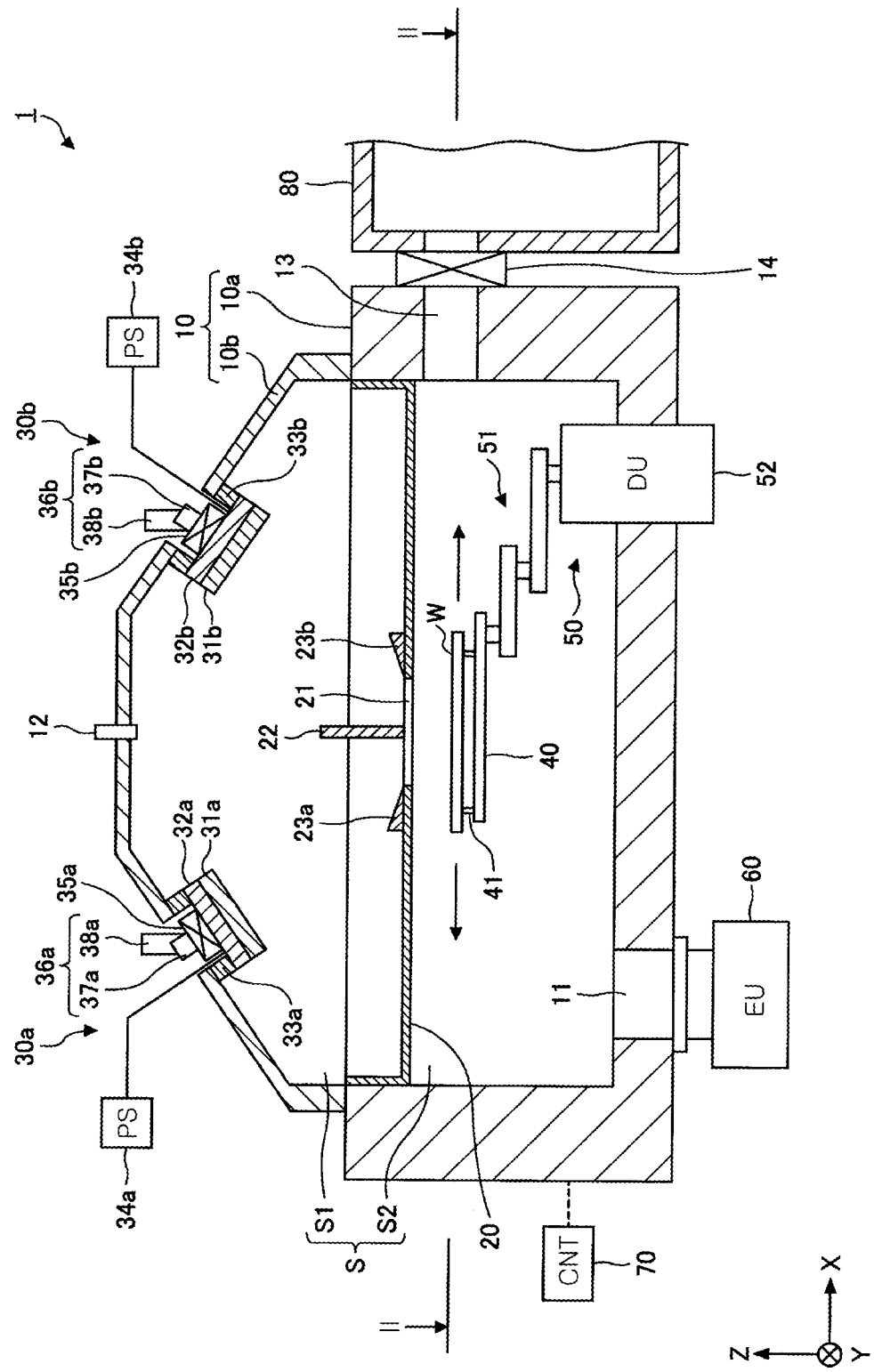
FIG. 1 is an example of a schematic cross-sectional view of a substrate processing apparatus according to a first embodiment.

Hereinafter, embodiments of the present disclosure will be described with reference to the accompanying drawings. Like reference numerals will be given to like parts throughout the drawings, and redundant description thereof may be omitted.

First Embodiment

Figure 2:
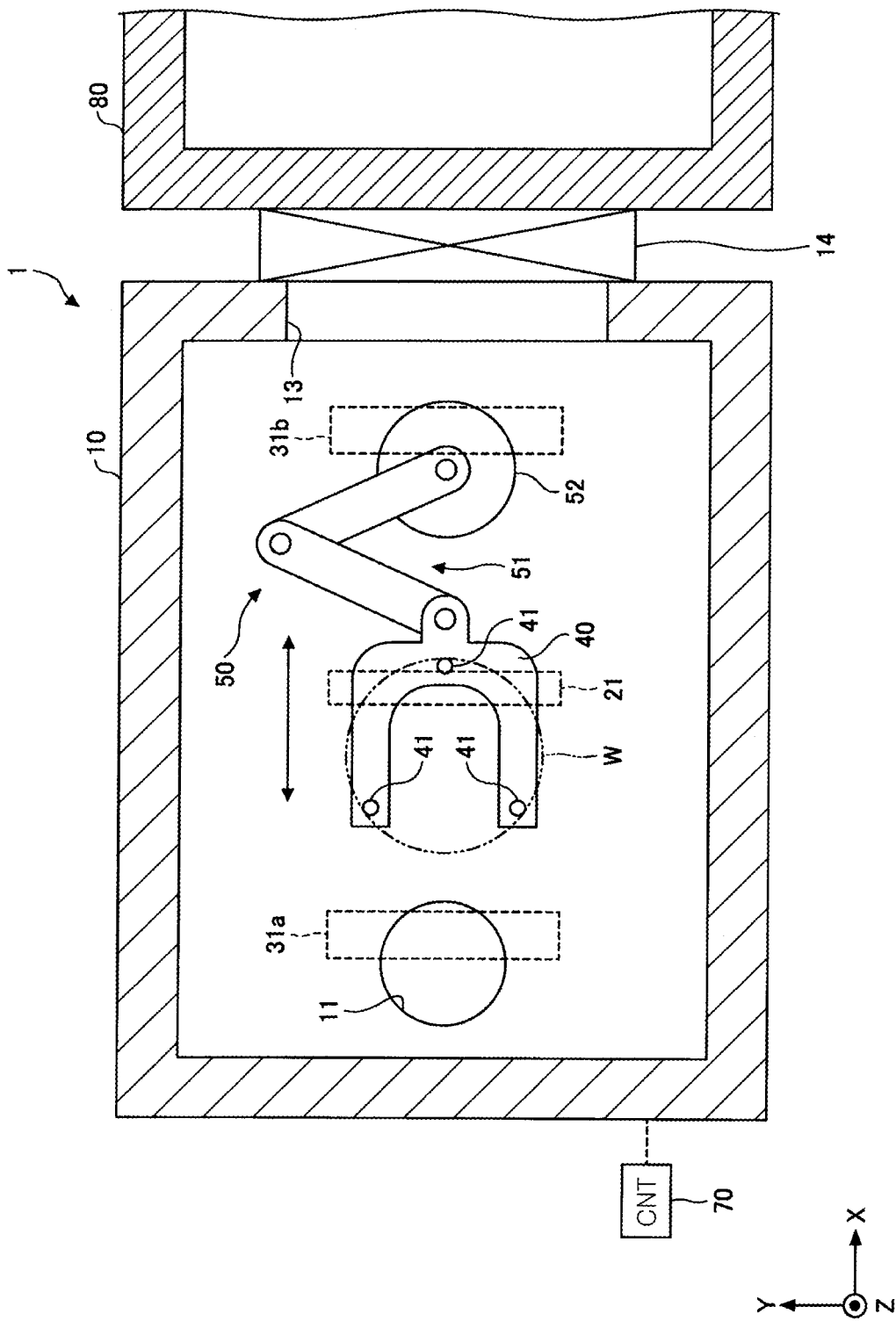
FIG. 2 is an example of a schematic cross-sectional view taken along a line II-II of the substrate processing apparatus shown in FIG. 1 according to the first embodiment.

A substrate processing apparatus (i.e., a sputtering apparatus) 1 according to a first embodiment will be described with reference to FIGS. 1 and 2. FIG. 1 is an example of a schematic cross-sectional view of the substrate processing apparatus 1 according to the first embodiment. FIG. 2 is an example of a schematic cross-sectional view of the substrate processing apparatus 1 according to the first embodiment that is taken along a line II-II shown in FIG. 1. In the following description, the X direction indicates one horizontal direction; the Y direction indicates a horizontal direction perpendicular to the X direction; and the Z direction indicates a vertical direction.

The substrate processing apparatus 1 includes a processing chamber 10, a sputter particle shielding plate 20, sputter particle emitting units 30a and 30b, a substrate support 40, a substrate moving mechanism 50, and an exhaust unit (EU) 60. The substrate processing apparatus 1 is, e.g., a physical vapor deposition (PVD) apparatus, and is a sputtering apparatus for forming a film by adhering sputter particles (i.e., film forming atoms) emitted from the sputter particle emitting units 30a and 30b onto a surface of a substrate W such as a semiconductor wafer or the like placed on the substrate support 40 in the processing chamber 10.

The processing chamber 10 includes a chamber main body 10a having an upper opening, and a lid 10b disposed to close the upper opening of the chamber main body 10a. The lid 10b has an inclined side surface. An inner space of the processing chamber 10 serves as a processing space S where the film formation is performed.

A gas exhaust port 11 is formed at a bottom portion of the processing chamber 10. The exhaust unit 60 is connected to the gas exhaust port 11. The exhaust unit 60 includes a pressure control valve and a vacuum pump. The processing space S is evacuated to a predetermined vacuum level by the exhaust unit 60.

A gas inlet port 12 for introducing a gas into the processing space S is inserted at the top of the processing chamber 10. A gas supply unit (not shown) is connected to the gas inlet port 12. A sputtering gas (e.g., an inert gas) supplied from the gas supply unit to the gas inlet port 12 is introduced into the processing space S.

A loading/unloading port 13 for loading/unloading the substrate W is formed on a sidewall of the processing chamber 10. The loading/unloading port 13 is opened and closed by a gate valve 14. The processing chamber 10 is disposed adjacent to a transfer chamber 80. The processing chamber 10 and the transfer chamber 80 communicate with each other by opening the gate valve 14. A pressure in the transfer chamber 80 is maintained at a predetermined vacuum level, and a transfer device (not shown) for loading/unloading the substrate W into/from the processing chamber 10 is disposed in the transfer chamber 80.

The sputter particle shielding plate 20 is formed as a substantially plate-shaped member, and is horizontally disposed at an intermediate position in a height direction (i.e, the Z direction) of the processing space S. An edge of the sputter particle shielding plate 20 is fixed to a sidewall of the chamber main body 10a. The sputter particle shielding plate 20 divides the processing space S into a first space S1 and a second space S2. The first space S1 is disposed above the sputter particle shielding plate 20. The second space S2 is disposed below the sputter particle shielding plate 20.

The sputter particle shielding plate 20 has a slit-shaped through-hole 21 through which sputter particles pass. The through-hole 21 penetrates through the sputter particle shielding plate 20 in a plate thickness direction thereof (i.e., the Z direction). The through-hole 21 is formed in a thin and elongated shape with the Y direction, which is one horizontal direction in the drawing, as a longitudinal direction. A length of the through-hole 21 in the Y direction is greater than a diameter of the substrate W. An obstructing plate 22 is disposed at the through-hole 21. Further, adjusting members 23a and 23b for adjusting an opening shape (or an opening area) of the through-hole 21 are disposed at the through-hole 21. The obstructing plate 22 and the adjusting members 23a and 23b will be described later with reference to FIGS. 3 and 4.

The sputter particle emitting unit 30a includes a target 31a, a target holder 32a, an insulating member 33a, a power supply (PS) 34a, a magnet 35a, and a magnet scanning mechanism 36a. The sputter particle emitting unit 30b includes a target 31b, a target holder 32b, an insulating member 33b, a power supply (PS) 34b, a magnet 35b, and a magnet scanning mechanism 36b.

The targets 31a and 31b are made of a material containing a constituent element of a film to be formed, and may be made of a conductive material or a dielectric material. Further, the targets 31a and 31b may be made of the same material or different materials.

The target holders 32a and 32b are made of a conductive material and are disposed above the sputter particle shielding plate 20 and at different positions on an inclined surface of the lid 10b of the processing chamber 10 via the insulating members 33a and 33b. In the example shown in FIG. 1, the target holders 32a and 32b are disposed at positions facing each other with the through-hole 21 interposed therebetween. However, the target holders 32a and 32b may be disposed at any position without being limited thereto. The target holders 32a and 32b respectively hold the targets 31a and 31b such that the targets 31a and 31b are positioned obliquely above the through-hole 21.

The power supplies 34a and 34b are electrically connected to the target holders 32a and 32b, respectively. The power supplies 34a and 34b may be DC power supplies when the targets 31a and 31b are made of a conductive material. The power supplies 34a and 34b may be radio-frequency (RF) power supplies when the targets 31a and 31b are made of a dielectric material. When the power supplies 34a and 34b are the RF power supplies, they are respectively connected to the target holders 32a and 32b via a matching unit. By applying a voltage to the target holders 32a and 32b, a sputtering gas is dissociated around the targets 31a and 31b. Then, ions in the dissociated sputtering gas collide with the targets 31a and 31b, and the sputter particles that are particles of the constituent material of the targets 31a and 31b are emitted from the targets 31a and 31b.

The magnets 35a and 35b are disposed on back surfaces of the target holders 32a and 32b, and are configured to reciprocate (or move) in the Y direction by the magnet scanning mechanisms 36a and 36b, respectively. The magnet scanning mechanisms 36a and 36b have, e.g., guides 37a and 37b and driving units 38a and 38b, respectively. The magnets 35a and 35b are guided by the guides 37a and 37b to reciprocate in the Y direction, respectively. The driving units 38a and 38b reciprocate the magnets 35a and 35b along the guides 37a and 37b, respectively.

The ions in the dissociated sputtering gas are attracted by magnetic fields of the magnets 35a and 35b and collide with the targets 31a and 31b. When the magnet scanning mechanisms 36a and 36b reciprocate the magnets 35a and 35b in the Y direction, respectively, the positions where the ions collide with the targets 31a and 31b, i.e., the positions where the sputter particles are emitted, are changed.

The substrate support 40 is disposed in the chamber main body 10a of the processing chamber 10 and horizontally supports the substrate W via support pins 41. The substrate support 40 is configured to be moveable linearly in the X direction that is one horizontal direction by the substrate moving mechanism 50. Therefore, the substrate W supported by the substrate support 40 is linearly moved in a horizontal plane by the substrate moving mechanism 50. The substrate moving mechanism 50 has a multi-joint arm 51 and a driving unit (DU) 52, and is configured to move the substrate support 40 in the X direction by driving the multi-joint arm 51 with the driving unit 52.

In other words, the moving direction (i.e., the Y direction) of the magnets 35a and 35b and the moving direction (i.e., the X direction) of the substrate W are orthogonal to each other. Further, the sputter particle emitting units 30a and 30b are disposed at both ends when viewed in the moving direction (i.e., the X direction) of the substrate W.

A controller (CNT) 70 includes a computer and controls the respective components of the substrate processing apparatus 1, such as the power supplies 34a and 34b, the driving units 38a and 38b, the driving unit 52, the exhaust unit 60 and the like. The controller 70 includes a main controller having a CPU for actually controlling those components, an input device, an output device, a display device, and a storage device. The storage device stores parameters of various processes executed by the substrate processing apparatus 1, and a storage medium in which a program, i.e., a processing recipe, for controlling the processes executed by the substrate processing apparatus 1 is stored, is set in the storage device. The main controller of the controller 70 calls a predetermined processing recipe stored in the storage medium, and causes the substrate processing apparatus 1 to execute a predetermined process based on the processing recipe.

Next, a film forming method in the substrate processing apparatus 1 according to the first embodiment will be described.

First, after the processing space S in the processing chamber 10 is exhausted, a sputtering gas (e.g., an inert gas) is introduced into the processing space S from the gas inlet port 12 to adjust a pressure in the processing space S to a predetermined pressure.

Next, the substrate support 40 is positioned at a substrate transfer position, and the gate valve 14 is opened so that the substrate W is placed on the substrate support 40 (on the support pins 41) by the transfer device (not shown) of the transfer chamber 80. Next, the transfer device is returned to the transfer chamber 80, and the gate valve 14 is closed.

Next, the controller 70 controls the substrate moving mechanism 50 (or the driving unit 52) to move the substrate W on the substrate support 40 in the X direction, and also controls the sputter particle emitting units 30a and 30b (the power supplies 34a and 34b and the driving units 38a and 38b) to obliquely emit sputter particles from the targets 31a and 31b.

In this specification, the sputter particles are emitted by applying a voltage from the power supplies 34a and 34b to the target holders 32a and 32b such that the ions in the sputtering gas dissociated around the targets 31a and 31b collide with the targets 31a and 31b. Further, the magnet scanning mechanisms 36a and 36b reciprocate the magnets 35a and 35b in the Y direction, respectively, to change the positions where the ions collide with the targets 31a and 31b, i.e., the positions where the sputter particles are emitted.

The sputter particles obliquely emitted from the targets 31a and 31b of the sputter particle emitting units 30a and 30b pass through the through-hole 21 formed in the sputter particle shielding plate 20 and are obliquely incident on the substrate W to be deposited thereon.

Figure 3:
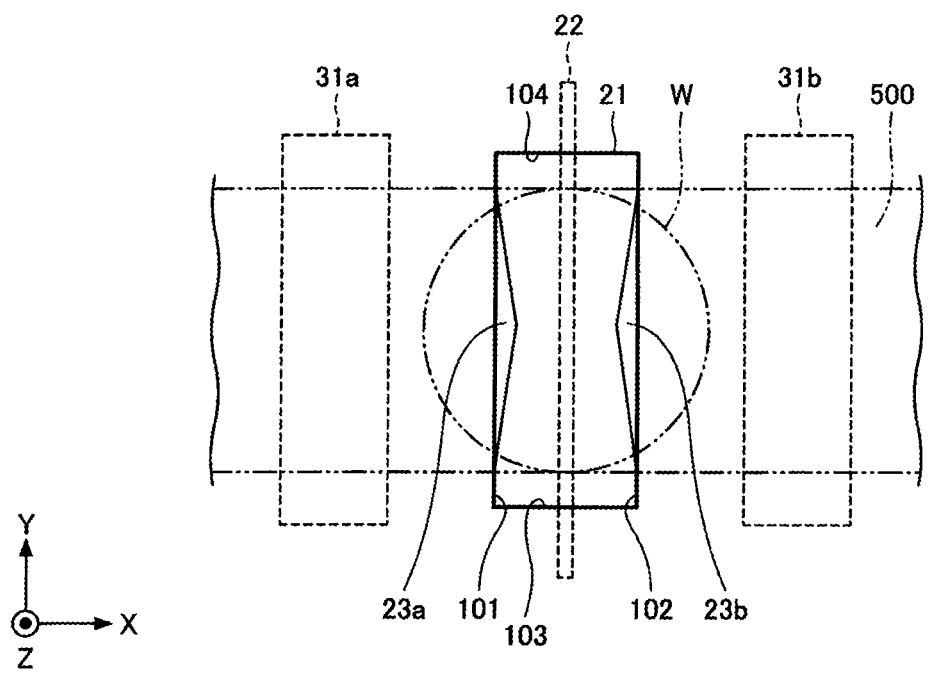
FIG. 3 is an example of a top view of a through-hole of a sputter particle shielding plate.

FIG. 3 is an example of a top view of the through-hole 21 of the sputter particle shielding plate 20. In FIG. 3, the positions of the targets 31a and 31b projected on the sputter particle shielding plate 20 are indicated by dashed lines. The position of the obstructing plate 22 projected on the sputter particle shielding plate 20 is indicated by dashed lines. An example of the substrate W transferred by the substrate moving mechanism 50 is indicated by dashed double-dotted lines. An example of a trajectory 500 of the transfer path of the substrate W transferred by the substrate moving mechanism 50 is indicated by dashed double-dotted lines.

The through-hole 21 has a substantially rectangular shape formed by edges 101 and 102 extending in the Y direction and edges 103 and 104 extending in the X direction. The edges 101 and 102 intersect with the trajectory 500 of the transfer path of the substrate W. Further, the edge 101 is formed on the target 31a side with respect to the center of the through-hole 21. The edge 102 is formed on the target 31b side with respect to the center of the through-hole 21. The edges 103 and 104 extend in the same direction as the transfer direction of the substrate W, and are formed outside the trajectory 500 of the transfer path of the substrate W.

The adjusting member 23a is disposed at the edge 101. The adjusting member 23a protrudes from the edge 101 toward the through-hole 21, for example, to adjust an opening shape (or the opening area) of the through-hole 21. Further, an adjusting member 23b is disposed at the edge 102. The adjusting member 23b protrudes from the edge 102 toward the through-hole 21, for example, to adjust an opening shape (or the opening area) of the through-hole 21.

The obstructing plate 22 is disposed to divide the through-hole 21. For example, the obstructing plate 22 extends in the Y direction to divide the through-hole 21 into the area at the edge 101 side where the adjusting member 23a is disposed and the area at the edge 102 side where the adjusting member 23b is disposed.

Figure 4:
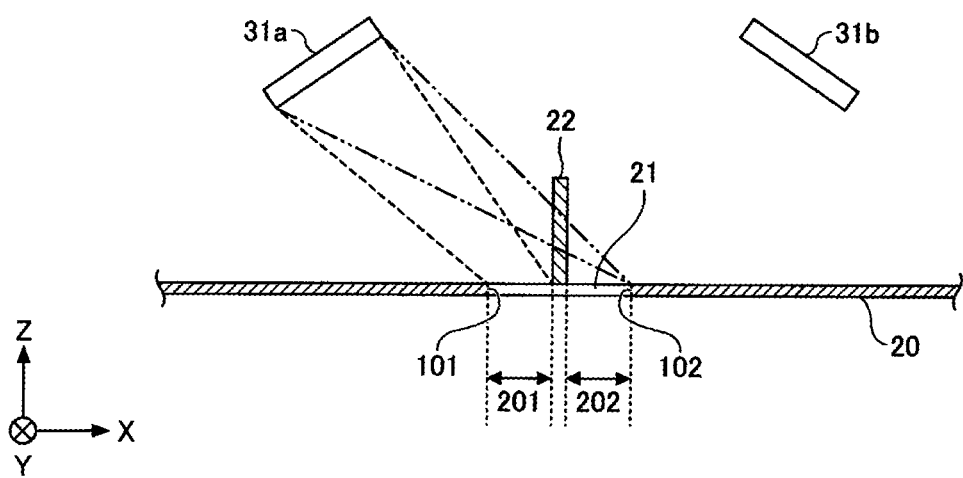
FIG. 4 schematically shows trajectories of sputter particles emitted from a target.

FIG. 4 schematically shows the trajectories of the sputter particles emitted from the target 31a. In FIG. 4, the adjusting members 23a and 23b are not illustrated.

The obstructing plate 22 divides the through-hole 21 into an opening region 201 and an opening region 202. Accordingly, the sputter particles emitted from the target 31a are incident on the substrate W while passing through the opening region 201 formed between the edge 101 and the obstructing plate 22 as indicated by dashed lines in FIG. 4. Similarly, the sputter particles emitted from the target 31b are incident on the substrate W while passing through the opening region 202 formed between the edge 102 and the obstructing plate 22.

With this configuration, the thickness distribution of the film formed by the sputter particles emitted from the target 31a can be adjusted by adjusting the adjusting member 23a at the edge 101. Further, the thickness distribution of the film formed by the sputter particles emitted from the target 31b can be adjusted by adjusting the adjusting member 23b at the edge 102. In other words, the film formation using the targets 31a and 31b can be adjusted (or controlled) independently.

In other words, as indicated by dashed double-dotted lines in FIG. 4, the obstructing plate 22 is disposed to hide the edge 102 when viewed from the target 31a. Similarly, the obstructing plate 22 is disposed to hide the edge 101 when viewed from the target 31b. With this configuration, it is possible to prevent the film formation using the sputter particles emitted from the target 31a from being affected even if the adjusting member 23b of the edge 102 is adjusted. Further, it is possible to prevent the film formation using the sputter particles emitted from the target 31b from being affected even if the adjusting member 23a of the edge 101 is adjusted. In other words, the film formation using the targets 31a and 31b can be adjusted (or controlled) independently.

The obstructing plate 22 may be disposed to hide the edge 102 when viewed from the target 31a and to hide the edge 101 when viewed from the target 31b. Therefore, the lower end of the obstructing plate 22 may be disposed above the upper surface of the sputter particle shielding plate 20, or may be disposed below the bottom surface of the sputter particle shielding plate 20 while passing through the through-hole 21. If the lower end of the obstructing plate 22 is formed below the bottom surface of the sputter particle shielding plate 20, the number of sputter particles incident on the substrate W is reduced, and the film forming rate is reduced. Therefore, in view of the film forming rate, it is preferable that the lower end of the obstructing plate 22 is formed above the upper surface of the sputter particle shielding plate 20.

The obstructing plate 22 is disposed to hide the edge 102 that is farther from the target 31a between the edge 101 and the edge 102 when seen from the target 31a. Further, the obstructing plate 22 is disposed to hide the edge 101 that is farther from the target 31b between the edge 101 and the edge 102 when viewed from the target 31b. Therefore, the obstructing plate 22 blocks components having low incident angles among the sputter particles incident on the substrate W from the targets 31a and 31b. Accordingly, the obstructing plate 22 can limit the incident angles of the sputter particles.

Second Embodiment

Figure 5:
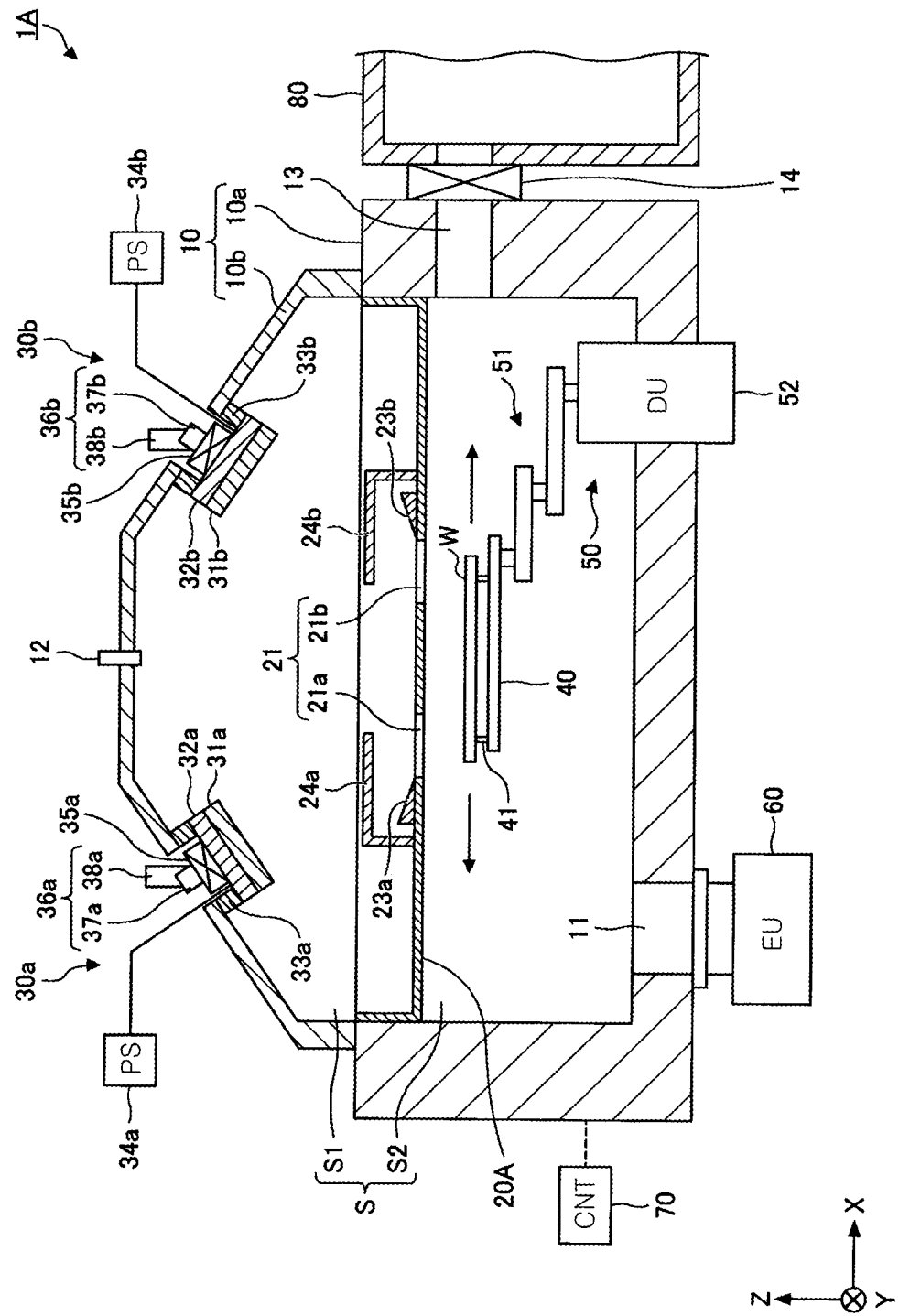
FIG. 5 is an example of a schematic cross-sectional view of a substrate processing apparatus according to a second embodiment.

A substrate processing apparatus (i.e., a sputtering apparatus) TA according to a second embodiment will be described with reference to FIG. 5. FIG. 5 is an example of a schematic cross-sectional view of the substrate processing apparatus TA according to the second embodiment. In this specification, the substrate processing apparatus TA according to the second embodiment is different from the substrate processing apparatus 1 (see FIG. 1) according to the first embodiment in a configuration of a sputter particle shielding plate 20A. The other configurations are the same, and redundant description thereof will be omitted.

The sputter particle shielding plate 20A has a through-hole 21 through which sputter particles pass. Specifically, the through-hole 21 has two slit-shaped through-holes 21a and 21b. The through-holes 21a and 21b penetrate through the sputter particle shielding plate 20A in a plate thickness direction thereof (i.e., the Z direction). The through-holes 21a and 21b are formed in a thin and elongated shape with the Y direction, which is one horizontal direction in the drawing, as a longitudinal direction. The lengths of the through-holes 21a and 21b in the Y direction are greater than the diameter of the substrate W. Further, a shield member 24a is disposed at the through-hole 21a, and a shield member 24b is disposed at the through-hole 21b. The adjusting member 23a for adjusting the opening shape (i.e., the opening area) of the through-hole 21a is disposed at the through-hole 21a. The adjusting member 23b for adjusting the opening shape (i.e., the opening area) of the through-hole 21b is disposed at through-hole 21b.

Figure 6:
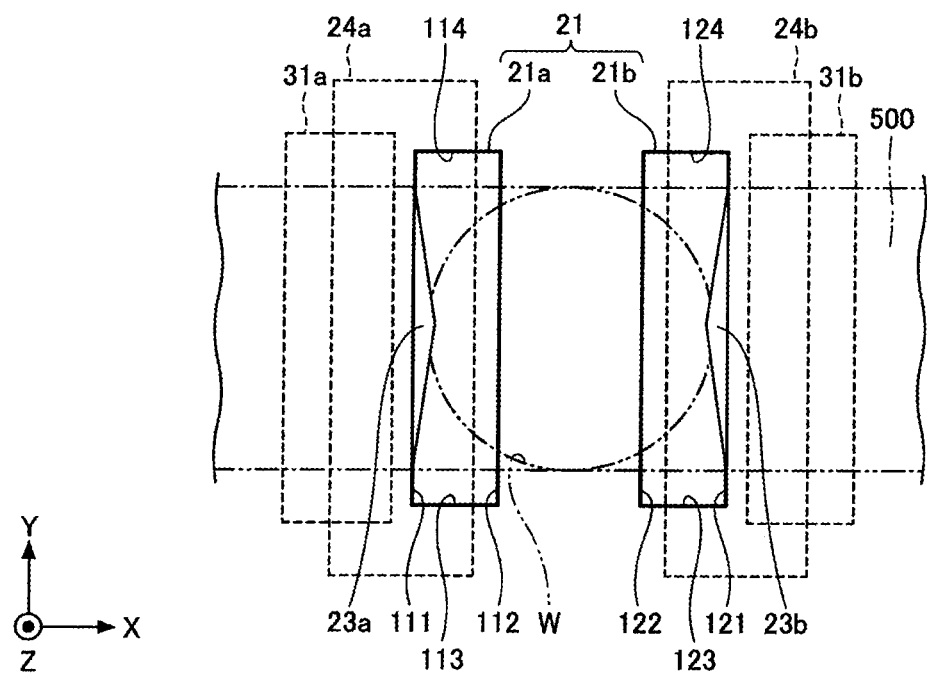
FIG. 6 is an example of a top view of a through-hole of a sputter particle shielding plate.

FIG. 6 is an example of a top view of the through-holes 21a and 21b in the sputter particle shielding plate 20A. In FIG. 6, the positions where the targets 31a and 31b are projected onto the sputter particle shielding plate 20A are indicated by dashed lines. The positions where the shield members 24a and 24b are projected onto the sputter particle shielding plate 20A are indicated by dashed lines. An example of the substrate W transferred by the substrate moving mechanism 50 is indicated by dashed double-dotted lines. An example of the trajectory 500 of the transfer path of the substrate W transferred by the substrate moving mechanism 50 is indicated by dashed double-dotted lines.

The through-hole 21a has a substantially rectangular shape formed by edges 111 and 112 extending in the Y direction and edges 113 and 114 extending in the X direction. The edges 111 and 112 intersect with the trajectory 500 of the transfer path of the substrate W. Further, the edge 111 is formed on the target 31a side with respect to the center of the through-hole 21a. The edge 112 is formed on the target 31b side with respect to the center of the through-hole 21a. The edges 113 and 114 extend in the same direction as the transfer direction of the substrate W and are formed outside the trajectory 500 of the transfer path of the substrate W.

The through-hole 21b has a substantially rectangular shape formed by edges 121 and 122 extending in the Y direction and edges 123 and 124 extending in the X direction. The edges 121 and 122 intersect with the trajectory 500 of the transfer path of the substrate W. Further, the edge 121 is formed on the target 31b side with respect to the center of the through-hole 21b. The edge 122 is formed on the target 31a side with respect to the center of the through-hole 21b. The edges 123 and 124 extend in the same direction as the transfer direction of the substrate W and are formed outside the trajectory 500 of the transfer path of the substrate W.

The adjusting member 23a is disposed at the edge 111. The adjusting member 23a protrudes from the edge 111 toward the through-hole 21a, for example, to adjust the opening shape (i.e., the opening area) of the through-hole 21a. Further, the adjusting member 23b is disposed at the edge 121. The adjusting member 23b protrudes from the edge 121 toward the through-hole 21b, for example, to adjust the opening shape (i.e., the opening area) of the through-hole 21b.

The shield member 24a has a plate portion 24a1 spaced apart from the sputter particle shielding plate 20A, and a leg portion 24a2 standing upright from the upper surface of the sputter particle shielding plate 20A to support the plate portion 24a1. The plate portion 24a1 of the shield member 24a is disposed to cover at least a part of the through-hole 21a when viewed from the target 31a.

Further, the shield member 24b is disposed to cover at least a part of the through-hole 21b when viewed from the target 31b. The shield member 24b has a plate portion 24b1 spaced apart from the sputter particle shielding plate 20A and a leg portion 24b2 standing upright from the upper surface of the sputter particle shielding plate 20A to support the plate portion 24b1. The plate portion 24b1 of the shield member 24b is disposed to cover at least a part of the through-hole 21b when viewed from the target 31b.

Figure 7:
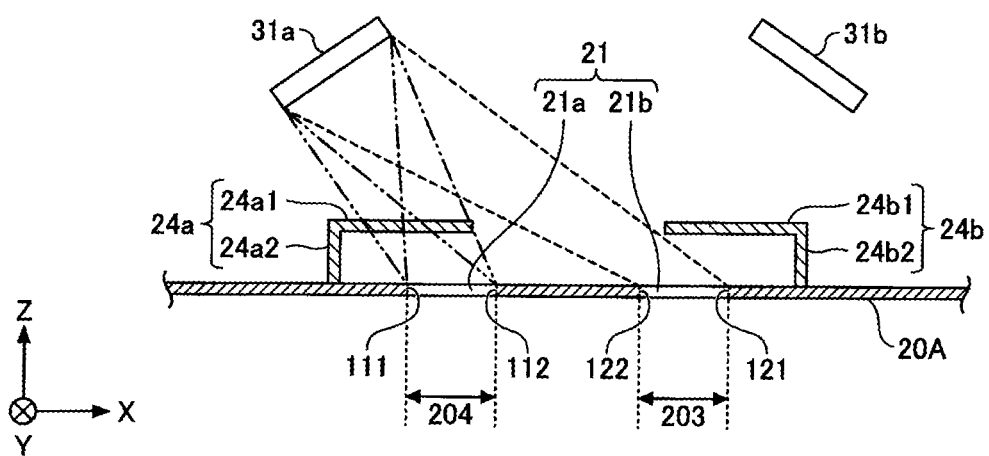
FIG. 7 schematically shows paths of sputter particles emitted from a target.

FIG. 7 schematically shows trajectories of the sputter particles emitted from the target 31a. In FIG. 7, the adjusting members 23a and 23b are not illustrated.

The shield members 24a and 24b divide the through-hole 21 (21a and 21b) into an opening region 203 and an opening region 204. Accordingly, as indicated by dashed lines in FIG. 7, the sputter particles emitted from the target 31a are incident on the substrate W while passing through the opening region 203 formed between the edge 121 and the edge 122. Similarly, the sputter particles emitted from the target 31b are incident on the substrate W while passing through the opening region 204 formed between the edge 111 and the edge 112.

With this configuration, the thickness distribution of the film formed by the sputter particles emitted from the target 31b can be adjusted by adjusting the adjusting member 23a at the edge 111. Further, the thickness distribution of the film formed by the sputter particles emitted from the target 31a can be adjusted by adjusting the adjusting member 23b at the edge 121. In other words, the film formation using the targets 31a and 31b can be adjusted (or controlled) independently.

In other words, as indicated by dashed double-dotted lines in FIG. 7, the shield member 24a is disposed to hide the edge 111 when viewed from the target 31a. With this configuration, it is possible to prevent the film formed by the sputter particles emitted from the target 31a from being affected even if the adjusting member 23a at the edge 111 is adjusted. Further, the shield member 24b is disposed to hide the edge 121 when viewed from the target 31b. With this configuration, it is possible to prevent the film formed by the sputter particles emitted from the target 31b from being affected even if the adjusting member 23b at the edge 121 is adjusted. In other words, the film formation using the targets 31a and 31b can be adjusted (or controlled) independently.

In the example shown in FIG. 7, the shield member 24a hides the through-hole 21a when viewed from the target 31*a*, and the shield member 24*b* hides the through-hole 21*b* when viewed from the target 31*b*. However, the present disclosure is not limited thereto. The shield member 24*a* may be configured to hide the edge 111 where the adjusting member 23*a* is disposed when viewed from the target 31*a*, and the shield member 24*b* may be configured to hide the edge 121 where the adjusting member 23*b* is disposed when viewed from the target 31*b*. With this configuration, the film formation using the targets 31*a* and 31*b* can be adjusted (or controlled) independently.

In the substrate processing apparatus 1A according to the second embodiment, the sputter particles blocked by the shield members 24*a* and 24*b* are adhered to the upper surfaces of the plate portions 24*a*1 and 24*b*1, thereby forming a film. With this configuration, even if the film formed on the upper surface of the plate portions 24*a*1, 24*b*1 is peeled off, it is possible to prevent the peeled film from being adhered to the substrate W.

The shield member 24*a* hides the edge 111, which is closer to the target 31*a*, between the edges 111 and 121. Further, the shield member 24*b* hides the edge 121, which is closer to the target 31*b*, between the edges 111 and 121. Therefore, the shield members 24*a* and 24*b* block components having high incident angles among the sputter particles incident on the substrate W from the targets 31*a* and 31*b*. Accordingly, the shield members 24*a* and 24*b* can limit the incident angles of the sputter particles.

While the substrate processing apparatuses 1 and 1A has been described above, the present disclosure is not limited to the above-described embodiment or the like, and various modifications and improvements can be made within the scope of the gist of the present disclosure described in the claims.

Figure 8:
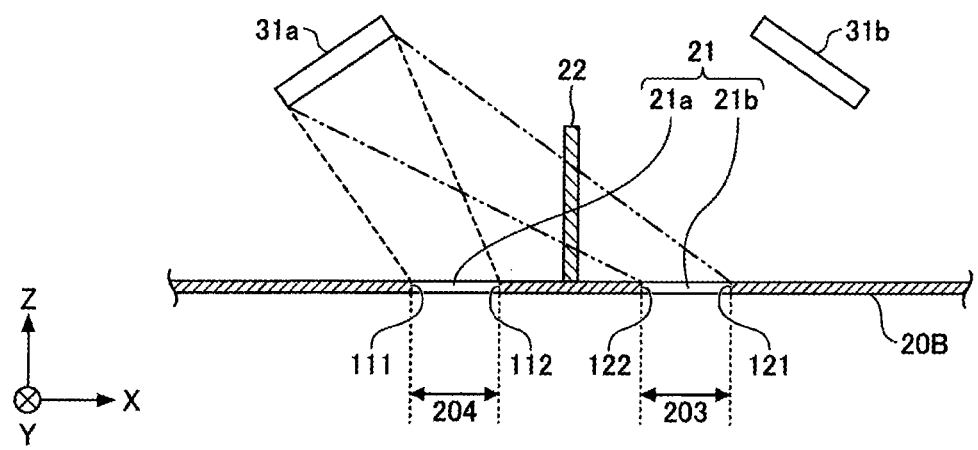
FIG. 8 schematically shows paths of sputter particles emitted from a target in a substrate processing apparatus according to a first modification.

Although FIG. 1 shows that one through-hole 21 is formed in the substrate processing apparatus 1 having the obstructing plate 22, the present disclosure is not limited thereto and a plurality of through-holes 21*a* and 21*b* may be formed. FIG. 8 schematically shows trajectories of sputter particles emitted from the target 31*a* in a substrate processing apparatus according to a first modification. In this specification, the substrate processing apparatus according to the first modification is different in a configuration of a sputter particle shielding plate 20B from other embodiments. The other configurations are the same, and redundant description thereof will be omitted.

The sputter particle shielding plate 20B has a through-hole 21 through which sputter particles pass. Specifically, the through-hole 21 has two slit-shaped through-holes 21*a* and 21*b*. An adjusting member (not shown in FIG. 8) for adjusting the opening shape (or the opening area) of the through-hole 21*a* is disposed at the through-hole 21*a*. An adjusting member (not shown in FIG. 8) for adjusting the opening shape (or the opening area) of the through-hole 21*b* is disposed at the through-hole 21*b*.

The obstructing plate 22 divides the through-hole 21 into an opening region 203 and an opening region 204. Accordingly, as indicated by dashed lines in FIG. 8, the sputter particles emitted from the target 31*a* are incident on the substrate W while passing through the opening region 204 formed between the edge 111 and the edge 112. Similarly, the sputter particles emitted from the target 31*b* are incident on the substrate W while passing through the opening region 203 formed between the edge 121 and the edge 122.

With this configuration, the thickness distribution of the film formed by the sputter particles emitted from the target 31*a* can be adjusted by adjusting the adjusting member at the edge 111. Further, the thickness distribution of the film formed by the sputter particles emitted from the target 31*b* can be adjusted by adjusting the adjusting member at the edge 121. In other words, the film formation using the targets 31*a* and 31*b* can be adjusted (or controlled) independently.

In other words, as indicated by dashed double-dotted lines in FIG. 8, the obstructing plate 22 is disposed to hide the edge 121 when viewed from the target 31*a*. With this configuration, it is possible to prevent the film formed by the sputter particles emitted from the target 31*a* from being affected even if the adjusting member of the edge 121 is adjusted. Further, the obstructing plate 22 is disposed to hide the edge 111 when viewed from the target 31*b*. With this configuration, it is possible to prevent the film formed by the sputter particles emitted from the target 31*b* from being affected even if the adjusting member of the edge 111 is adjusted. In other words, the film formation using the targets 31*a* and 31*b* can be adjusted (or controlled) independently.

Figure 9:
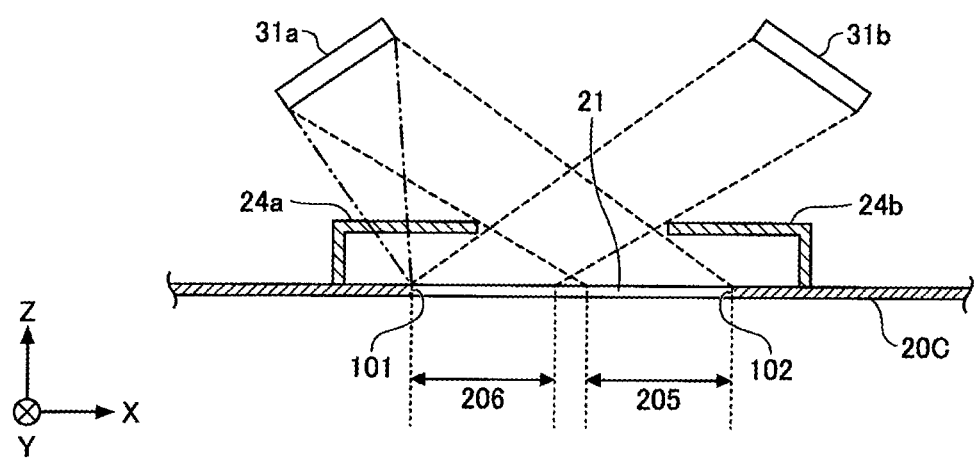
FIG. 9 schematically shows paths of sputter particles emitted from a target in a substrate processing apparatus according to a second modification.

Although FIG. 5 shows that the multiple through-holes 21 (21*a* and 21*b*) are formed in the substrate processing apparatus TA having the shield members 24*a* and 24*b*, the present disclosure is not limited thereto and one through-hole 21 may be formed. FIG. 9 schematically shows trajectories of sputter particles emitted from the targets 31*a* and 31*b* in a substrate processing apparatus according to a second modification. In this specification, the substrate processing apparatus according to the second modification is different from other embodiments in a configuration of a sputter particle shielding plate 20C. Other configurations are the same, and redundant description thereof will be omitted.

The sputter particle shielding plate 20C has a slit-shaped through-hole 21 through which sputter particles pass. An adjusting member (not shown in FIG. 9) for adjusting the opening shape (or the opening area) of the through-hole 21 is disposed at the edge 101 of the through-hole 21. An adjusting member (not shown in FIG. 9) for adjusting the opening shape (or the opening area) of the through-hole 21 is disposed at the edge 102 of the through-hole 21.

The shield members 24*a* and 24*b* divide the through-hole 21 into an opening region 205 and an opening region 206. Accordingly, as indicated by dashed lines in FIG. 9, the sputter particles emitted from the target 31*a* are incident on the substrate W while passing through the opening region 205 formed between the edge 102 and the shield member 24*a*. Similarly, the sputter particles emitted from the target 31*b* are incident on the substrate W while passing through the opening region 206 formed between the edge 101 and the shield member 24*b*.

With this configuration, the thickness distribution of the film formed by the sputter particles emitted from the target 31*b* can be adjusted by adjusting the adjusting member at the edge 101. Further, the thickness distribution of the film formed by the sputter particles emitted from the target 31*a* can be adjusted by adjusting the adjusting member at the edge 102. In other words, the film formation using the targets 31*a* and 31*b* can be adjusted (or controlled) independently.

In other words, as indicated by dashed double-dotted lines in FIG. 9, the shield member 24*a* is disposed to hide the edge 101 when viewed from the target 31*a*. With this configuration, it is possible to prevent the film formed by the sputter particles emitted from the target 31*a* from being affected even if the adjusting member at the edge 101 is adjusted. Further, the shield member 24*b* is disposed to hide the edge 102 when viewed from the target 31*b*. With this configuration, it is possible to prevent the film formed by the sputter particles emitted from the target 31*b* from being affected even if the adjusting member at the edge 102 is adjusted. In other words, the film formation using the targets 31*a* and 31*b* can be adjusted (or controlled) independently.

Third Embodiment

Figure 10:
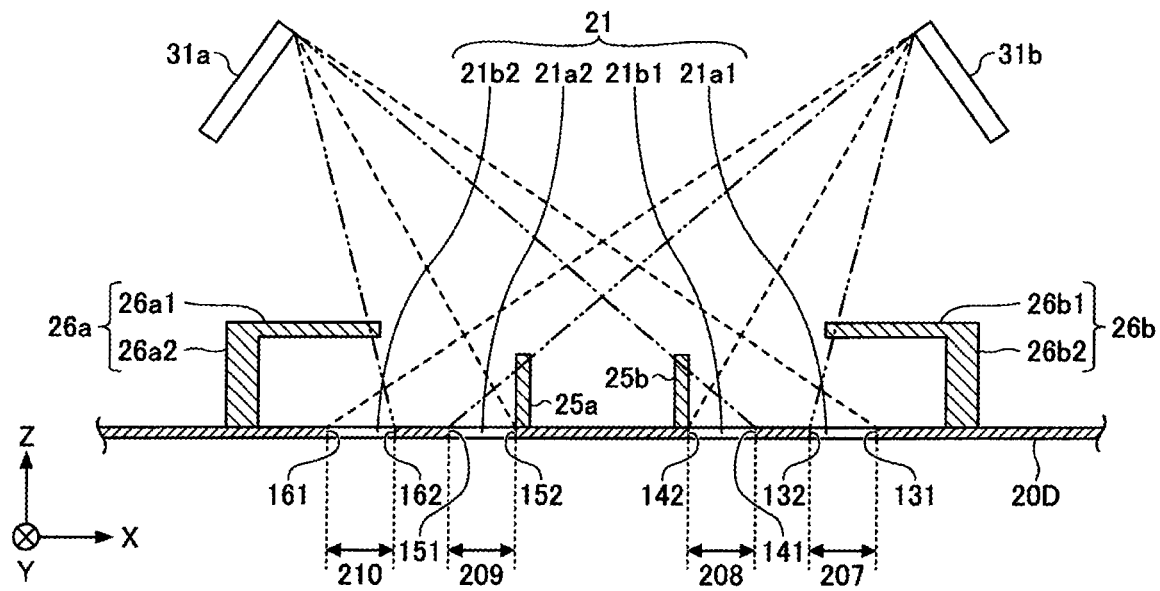
FIG. 10 schematically shows a sputter particle shielding plate and paths of sputter particles emitted from a target in a substrate processing apparatus according to a third embodiment.

A substrate processing apparatus (i.e., a sputtering apparatus) according to a third embodiment will be described with reference to FIGS. 10 to 12. FIG. 10 schematically shows the sputter particle shielding plate 20D and the trajectories of the sputter particles emitted from the targets 31*a* and 31*b* in a substrate processing apparatus according to a third embodiment. In this specification, the substrate processing apparatus according to the third embodiment is different from the substrate processing apparatus 1 (see FIG. 1) according to the first embodiment and the substrate processing apparatus TA (see FIG. 5) according to the second embodiment in a configuration of a sputter particle shielding plate 20D. The other configurations are the same, and redundant description thereof will be omitted.

The sputter particle shielding plate 20D has a through-hole 21 through which sputter particles pass. Specifically, the through-hole 21 has four slit-shaped through-holes 21*a*1, 21*b*1, 21*a*2, and 21*b*2. The through-holes 21*a*1, 21*b*1, 21*a*2, and 21*b*2 are formed in that order when viewed in the –X direction (i.e., the transfer direction of the substrate W). The through-holes 21*a*1, 21*b*1, 21*a*2, and 21*b*2 penetrate through the sputter particle shielding plate 20D in a plate thickness direction thereof (i.e., the Z direction). The through-holes 21*a*1, 21*b*1, 21*a*2, and 21*b*2 are formed in a thin and elongated shape with the Y direction, which is one horizontal direction in the drawing, as a longitudinal direction. The lengths of the through-holes 21*a*1, 21*b*1, 21*a*2, and 21*b*2 in the Y direction are greater than the diameter of the substrate W. Further, obstructing plates 25*a* and 25*b* standing upright from the sputter particle shielding plate 20D are disposed at the through-hole 21. Further, shield members 26*a* and 26*b* are disposed at the through-hole 21. Adjusting members (not shown) for adjusting the opening shape (or the opening area) of the through-hole may be disposed at the through-holes 21*a*1, 21*b*1, 21*a*2, and 21*b*2.

Figure 11:
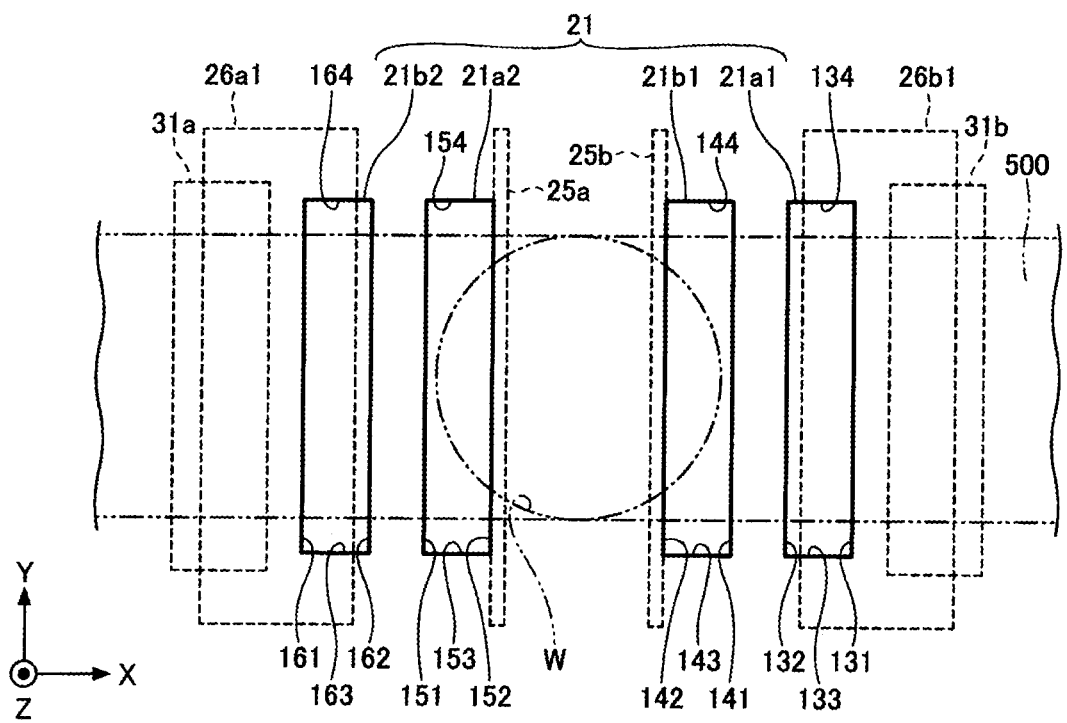
FIG. 11 is an example of a top view of a through-hole of a sputter particle shielding plate.

FIG. 11 is an example of a top view of the through-holes 21*a*1, 21*b*1, 21*a*2, and 21*b*2 of the sputter particle shielding plate 20D. In FIG. 11, the positions where the targets 31*a* and 31*b* are projected onto the sputter particle shielding plate 20D are indicated by dashed lines. Further, the positions where the shield members 26*a* and 26*b* are projected onto the sputter particle shielding plate 20D are indicated by dashed lines. Further, an example of the substrate W transferred by the substrate moving mechanism 50 is indicated by dashed double-dotted lines. Further, an example of the trajectory 500 of the transfer path of the substrate W transferred by the substrate moving mechanism 50 is indicated by dashed double-dotted lines.

The through-hole 21*a*1 has a substantially rectangular shape formed by edges 131 and 132 extending in the Y direction and edges 133 and 134 extending in the X direction. The edges 131 and 132 intersect with the trajectory 500 of the transfer path of the substrate W. Further, the edge 131 is formed on the target 31*b* side with respect to the center of the through-hole 21*a*1. The edge 132 is formed on the target 31*a* side with respect to the center of the through-hole 21*a*1. The edges 133 and 134 extend in the same direction as the transfer direction of the substrate W and are formed outside the trajectory 500 of the transfer path of the substrate W.

The through-hole 21*b*1 has a substantially rectangular shape formed by edges 141 and 142 extending in the Y direction and edges 143 and 144 extending in the X direction. The edges 141 and 142 intersect with the trajectory 500 of the transfer path of the substrate W. Further, the edge 141 is formed on the target 31*b* side with respect to the center of the through-hole 21*b*1. The edge 142 is formed on the target 31*a* side with respect to the center of the through-hole 21*b*1. The edges 143 and 144 extend in the same direction as the transfer direction of the substrate W, and are formed outside the trajectory 500 of the transfer path of the substrate W.

The through-hole 21*a*2 has a substantially rectangular shape formed by edges 151 and 152 extending in the Y direction and edges 153 and 154 extending in the X direction. The edges 151 and 152 intersect with the trajectory 500 of the transfer path of the substrate W. Further, the edge 151 is formed on the target 31*a* side with respect to the center of the through-hole 21*a*2. The edge 152 is formed on the target 31*b* side with respect to the center of the through-hole 21*a*2. The edges 153 and 154 extend in the same direction as the transfer direction of the substrate W, and are formed outside the trajectory 500 of the transfer path of the substrate W.

The through-hole 21*b*2 has a substantially rectangular shape formed by edges 161 and 162 extending in the Y direction and edges 163 and 164 extending in the X direction. The edges 161, 162 intersect with the trajectory 500 of the transfer path of the substrate W. Further, the edge 161 is formed on the target 31*a* side with respect to the center of the through-hole 21*b*2. The edge 162 is formed on the target 31*b* side with respect to the center of the through-hole 21*b*2. The edges 163 and 164 extend in the same direction as the transfer direction of the substrate W, and are formed outside the trajectory 500 of the transfer path of the substrate W.

The edge 131 and/or the edge 132 may be provided with an adjusting member (not shown) for adjusting the opening shape (or the opening area) of the through-hole 21*a*1. Further, the edge 141 and/or the edge 142 may be provided with an adjusting member (not shown) for adjusting the opening shape (or the opening area) of the through-hole 21*b*1. Further, the edge 151 and/or the edge 152 may be provided with an adjusting member (not shown) for adjusting the opening shape (or the opening area) of the through-hole 21*a*2. Further, the edge 161 and/or the edge 162 may be provided with an adjusting member (not shown) for adjusting the opening shape (or the opening area) of the through-hole 21*b*2. An adjusting member protrudes from an edge toward a through-hole, for example, to adjust the opening shape (or the opening area) of the through-hole.

Referring back to FIG. 10, as indicated by dashed double-dotted lines therein, the obstructing plate 25*a* is disposed to hide the through-hole 21*a*2 (or the edges 151 and 152) when viewed from the target 31*b*. Similarly, the obstructing plate 25*b* is disposed to hide the through-hole 21*b*1 (or the edges 141 and 142) when viewed from the target 31*a*.

The shield member 26*a* has a plate portion 26*a*1 spaced apart from the sputter particle shielding plate 20D, and a leg portion 26*a*2 standing upright from the upper surface of the sputter particle shielding plate 20D to support the plate portion 26*a*1. As indicated by the dashed double-dotted lines in FIG. 10, the plate portion 26*a*1 of the shield member 26*a* is disposed to cover the through-hole 21*b*2 when viewed from the target 31*a*. Further, the shield member 26*b* has a plate portion 26*b*1 spaced apart from the sputter particle shielding plate 20D, and a leg portion 26*b*2 standing upright from the upper surface of the sputter particle shielding plate 20D to support the plate portion 26*b*1. As indicated by the dashed double-dotted lines in FIG. 10, the plate portion 26*b*1 of the shield member 26*b* is disposed to cover the through-hole 21*a*1 when viewed from the target 31*b*.

The obstructing plates 25a and 25b and the shield members 26a, 26b divide the through-hole 21 (21a1, 21b1, 21a2, and 21b2) into opening regions 207 to 210. Accordingly, as indicated by dashed lines in FIG. 10, the sputter particles emitted from the target 31a are incident on the substrate W while passing through the opening region 207 formed between the edge 131 and the edge 132. Further, the sputter particles emitted from the target 31b are incident on the substrate W while passing through the opening region 208 formed between the edge 141 and the edge 142. Further, the sputter particles emitted from the target 31a are incident on the substrate W while passing through the opening region 209 formed between the edge 151 and the edge 152. Further, the sputter particles emitted from the target 31b are incident on the substrate W while passing through the opening region 210 formed between the edge 161 and the edge 162.

FIGS. 12A to 12D are schematic views showing examples of the incident directions of the sputter particles incident on a protrusion 600 of the substrate W. In this specification, it is assumed that the substrate W is transferred in the −X direction (from the right side to the left side in FIG. 10). Further, the protrusion 600 such as a trench or the like is formed on the surface of the substrate W.

Figure 12A:
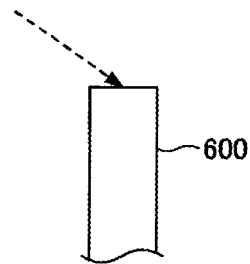
FIGS. 12A to 12D schematically show exemplary incident directions of sputter particles incident on a protrusion of a substrate.

When the substrate W is transferred in the −X direction, first, the substrate W passes through a position below the through-hole 21a1. As shown in FIG. 10, the sputter particles emitted from the target 31a are incident on the substrate W while passing through the through-hole 21a1. On the other hand, the sputter particles emitted from the target 31b are blocked by the plate portion 26b1 of the shield member 26b. Therefore, as shown in FIG. 12A, the sputter particles having a large incident angle emitted from the target 31a are incident on the protrusion 600 while passing through the through-hole 21a1 (i.e., the opening region 207).

Figure 12B:
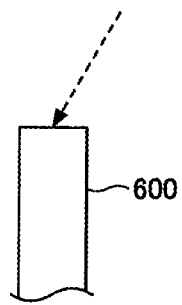

Further, when the substrate W is transferred in the −X direction, the substrate W passes through a position below the through-hole 21b1. As shown in FIG. 10, the sputter particles emitted from the target 31b are incident on the substrate W while passing through the through-hole 21b1. On the other hand, the sputter particles emitted from the target 31a are blocked by the shielding plate 25b. Therefore, as shown in FIG. 12B, the sputter particles having a small incident angle emitted from the target 31b are incident on the protrusion 600 while passing through the through-hole 21b1 (i.e., the opening region 208).

Figure 12C:
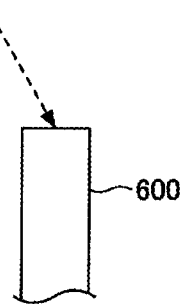

Further, when the substrate W is transferred in the −X direction, the substrate W passes through a position below the through-hole 21a2. As shown in FIG. 10, the sputter particles emitted from the target 31a are incident on the substrate W while passing through the through-hole 21a2. On the other hand, the sputter particles emitted from the target 31b are blocked by the shielding plate 25a. Therefore, as shown in FIG. 12C, the sputter particles having a small incident angle emitted from the target 31a are incident on the protrusion 600 while passing through the through-hole 21a2 (i.e., the opening region 209).

Figure 12D:
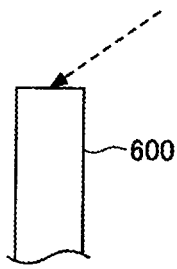

Further, when the substrate W is transferred in the −X direction, the substrate W passes through a position below the through-hole 21b2. As shown in FIG. 10, the sputter particles emitted from the target 31b are incident on the substrate W while passing through the through-hole 21b2. On the other hand, the sputter particles emitted from the target 31a are blocked by the plate portion 26a1 of the shield member 26a. Therefore, as shown in FIG. 12D, the sputter particles having a large incident angle emitted from the target 31d are incident on the protrusion 600 while passing through the through-hole 21d2 (i.e., the opening region 210).

As described above, in accordance with to the substrate processing apparatus according to the third embodiment, the film formation using the sputter particles emitted from the target 31a and the film formation using the sputter particles emitted from the target 31b may be repeated alternately (e.g., twice in the example of FIG. 10) by moving the substrate W once (i.e., 1 scan). Further, by adjusting the positions or the opening shapes of the through-holes 21a1, 21b1, 21a2, and 21b2, the incident angles and the amount of the sputter particles incident on the substrate W can be adjusted depending on the characteristics of the materials of the targets 31a and 31b. Accordingly, a symmetrical film can be efficiently formed on both sides (i.e., the front side and the rear side in the transfer direction of the substrate W) of the protrusion 600 of the pattern formed on the substrate W.

By adjusting the opening shape of the through-hole 21a1, the thickness distribution of the film formed by the sputter particles having large incident angles emitted from the target 31a can be adjusted. By adjusting the opening shape of the through-hole 21b1, the thickness distribution of the film formed by the sputter particles having small incident angles emitted from the target 31b can be adjusted. By adjusting the opening shape of the through-hole 21a2, the thickness distribution of the film formed by the sputter particles having small incident angles emitted from the target 31a can be adjusted. By adjusting the opening shape of the through-hole 21b2, the thickness distribution of the film formed by the sputter particles having large incident angles emitted from the target 31b can be adjusted. In other words, the film formation can be adjusted (or controlled) independently utilizing the difference between the targets 31a and 31b and the difference in the incident angles.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A sputtering apparatus comprising:
    a first target and a second target that emit sputter particles;
    a substrate support configured to support a substrate;
    a shielding plate disposed between the first and the second target and the substrate and having a through-hole through which the sputter particles pass, the through-hole having a first opening region through which the sputter particles emitted from the first target pass and a second opening region through which the sputter particles emitted from the second target pass; and
    an obstructing mechanism configured to obstruct the sputter particles emitted from the first target in passing through the second opening region and the sputter particles emitted in the second target from passing through the first opening region,
    wherein the through-hole has a first edge provided with a first adjusting member configured to adjust an opening area of the through-hole and a second edge provided with a second adjusting member configured to adjust the opening area of the through-hole,
    wherein the first opening region has the first edge and does not have the second edge, and
    wherein the second opening region has the second edge and does not have the first edge.

2. The sputtering apparatus of claim 1, wherein the obstructing mechanism is an obstructing plate disposed above the through-hole.

3. The sputtering apparatus of claim 1, wherein the obstructing mechanism is a shield member that is spaced apart from the shielding plate and has a plate portion that covers at least a part of the through-hole.

4. The sputtering apparatus of claim 1, wherein the through-hole further has a third opening region through which the sputter particles emitted from the first target pass and a fourth opening region through which the sputter particles emitted from the second target pass, the first opening region, the second opening region, the third opening region, and the fourth opening region are arranged in that order in a transfer direction of the substrate, and the obstructing mechanism obstructs the sputter particles emitted from the first target in passing through the fourth opening region and obstructs the sputter particles emitted from the second target in passing through the third opening region.

5. The sputtering apparatus of claim 4, wherein the obstructing mechanism has an obstructing plate standing upward from the shielding plate.

6. The sputtering apparatus of claim 4, wherein the obstructing mechanism has a shield member that is spaced apart from the shielding plate and has a plate portion that covers at least a part of the through-hole.

7. The sputtering apparatus of claim 5, wherein the obstructing mechanism has a shield member that is spaced apart from the shielding plate and has a plate portion that covers at least a part of the through-hole.

* * * * *